United States Patent [19]
Jones et al.

[11] Patent Number: 5,400,274
[45] Date of Patent: Mar. 21, 1995

[54] MEMORY HAVING LOOPED GLOBAL DATA LINES FOR PROPAGATION DELAY MATCHING

[75] Inventors: Kenneth W. Jones; Lawrence F. Childs, both of Austin, Tex.

[73] Assignee: Motorola Inc., Schaumburg, Ill.

[21] Appl. No.: 236,845

[22] Filed: May 2, 1994

[51] Int. Cl.$^6$ .............................................. G11C 5/06
[52] U.S. Cl. ........................................ 365/63; 365/51
[58] Field of Search ................ 365/63, 52, 72, 230.03, 365/51

[56] References Cited

U.S. PATENT DOCUMENTS 4,926,378  5/1990  Uchida et al. .................... 365/63
5,021,998  6/1991  Suzuki et al. .................... 365/51

*Primary Examiner*—Eugene R. LaRoche
*Assistant Examiner*—Vu Le
*Attorney, Agent, or Firm*—Daniel D. Hill

[57] ABSTRACT

A synchronous memory (50) having a looped global data line (80) reduces a difference between minimum and maximum propagation delays between different locations in a memory array (51) during a read cycle of the memory (50). The looped global data line (80) has a first portion (80') and a second portion (80''). The first portion (80') extends along an edge of the memory array (51) in a direction substantially parallel to a direction of the word lines of the array (51). Sense amplifiers (73-78) are coupled to the first portion (80') of the looped global data line (80). At one end of the array (51), the second portion (80'') of the looped global data line extends back in an opposite direction to the first portion (80') and is coupled to output data circuits (84). Reducing the difference in propagation delays improves noise margins and allows increased operating speed.

17 Claims, 2 Drawing Sheets

FIG. 1 -PRIOR ART-

MEMORY HAVING LOOPED GLOBAL DATA LINES FOR PROPAGATION DELAY MATCHING

FIELD OF THE INVENTION

This invention relates generally to memories, and more particularly, to an integrated circuit memory having looped global data lines for propagation delay matching.

BACKGROUND OF THE INVENTION

A synchronous SRAM (static random access memory) is typically used as a high speed cache in a data processing system. When being used as a cache, the synchronous SRAM is under the control of a single system clock. The system clock is used to generate one or more internal clock signals that are used to control the timing of the read and write operations of the synchronous SRAM.

FIG. 1 illustrates in block diagram form, prior art synchronous SRAM 10. SRAM 10 includes memory cell array 11. Array 11 is organized in a plurality of rows and columns, and is subdivided into blocks 12–17. Memory cell 46 is shown in block 12, and memory cell 47 is shown in block 17. Memory cells 46 and 47 are representative of the memory cells of array 11. Memory cell 46 is coupled to a bit line pair labeled "$BL_2$" and "$BL_2^*$", and to a word line labeled "$WL_2$". Memory cell 47 is coupled to a bit line pair labeled "$BL_1$" and "$BL_1^*$", and to a word line labeled "$WL_1$". The bit line pairs are commonly used for both reading data from, and writing data into, the memory cell. The memory cells of array 11 are addressable through row decoding and column decoding. Row decoding includes address registers/predecoders 41 and row select 42. Column decoders 25 include address registers/predecoders 45 and local column decoders 26–31, which couple a bit line pair to a sense amplifier. A block of sense amplifiers 32 includes shared sense amplifiers 33–38. Each memory cell has a unique address at an intersection of a row and a column. Note that an asterisk (*) after a signal name indicates that the signal is a logical complement of a signal having the same name but lacking the asterisk.

To read a data bit from memory cell 47, a row address labeled "ROW ADDRESS" and a column address labeled "COLUMN ADDRESS" are provided to memory 10. The application of the addresses are timed by clock signal $CLK_1$. Row select 42 provides a row select signal labeled "$RS_1$" to word line drivers 24. Word line drivers 24 select word line $WL_1$. A predecoded column address PREDECODED COLUMN ADDRESS is provided to column decoders 25. Local column decoders 31 couples bit line pair $BL_2$ and $BL_1^*$ to shared sense amplifiers 38. The data bit exists as a relatively small differential voltage on the pair of complementary bit lines. A sense amplifier from shared sense amplifiers 38 detects and amplifies the differential voltage and communicates it to output data multiplexer 43 as global data line signals GDL/GDL*, via read global data lines 40. Data register/buffer 44 receives a data signal corresponding to the data bit and latches it in response to clock signal $CLK_2$.

To read a different data bit, such as memory cell 46, the same sequence of events occurs as when reading from memory cell 47, except that an address causes row select signal $RS_2$ to select word line $WL_1$, and local column decoder 26 to couple bit line pair $BL_1$ and $BL_1^*$ to shared sense amplifiers 33. Row select signal $RS_2$ must travel the length of array 11 to select word line $WL_1$, and global data line signals GDL/GDL* must travel along global data lines 40 for the length of array 11. As a result, the access time for memory cell 46 is longer than the access time to memory cell 47. For synchronous memories that have a relatively small array size, or relatively slow clock cycle time, different access times to different parts of the array are not a problem. But in very large arrays that have very fast clock cycle times, the difference in access time to different parts of the array may cause unacceptable data signal skewing, which results from increased propagation delay from distant cells, that results in less timing margin for output data multiplexer 43 for a given clock period, and limits the speed at which the output clock $CLK_2$ can operate. The data signal skewing problem becomes even worse as the size of the memory cell array is increased, or as higher clock speeds are demanded.

Some integrated circuit memories which use a technique known as revolutionary pinout have input/output circuitry on both sides of the array of the memory cells allowing for shorter data paths and faster access times. However, as memory arrays become large and clock speeds increase, the revolutionary pinout technique does not completely solve the data signal skewing problem.

SUMMARY OF THE INVENTION

Accordingly, there is provided, in one form, an integrated circuit memory having an array of memory cells and a looped global data line. The array of memory cells is arranged in rows and columns. A memory cell of the array is coupled to a word line and to a bit line pair. The looped global data line is positioned proximate with, and extending substantially parallel to, an edge of the array, from a first end of the array to a second end of the array. The looped global data line has a loop at the second end of the array, and extends substantially parallel to the edge of the array, from the loop back to the first end of the array. The looped global data line provide a data signal corresponding to data stored in a selected memory cell of the array. These and other features and advantages will be more clearly understood from the following detailed description taken in conjunction with the accompanying drawings.

DESCRIPTION OF A PREFERRED EMBODIMENT

Generally, the present invention provides a memory having looped global data lines. The looped global data lines reduce a difference between the minimum propagation delay and the maximum propagation delay of output data signals in order to reduce data signal skew. This is accomplished by providing looped read global data lines that have two portions. A first portion extends along an edge of a memory array in a direction substantially parallel to a direction of the word lines of the array. The memory array is coupled to the first portion of the looped global data lines. At one end of the array, a second portion of the looped global data lines extends back in an opposite direction to the first portion and is coupled to output data circuits. This reduces the amount of data signal skew resulting from unequal propagation delay times from different locations of the memory array, thus improving noise margins and allowing for increased operating speed.

Figure 1:
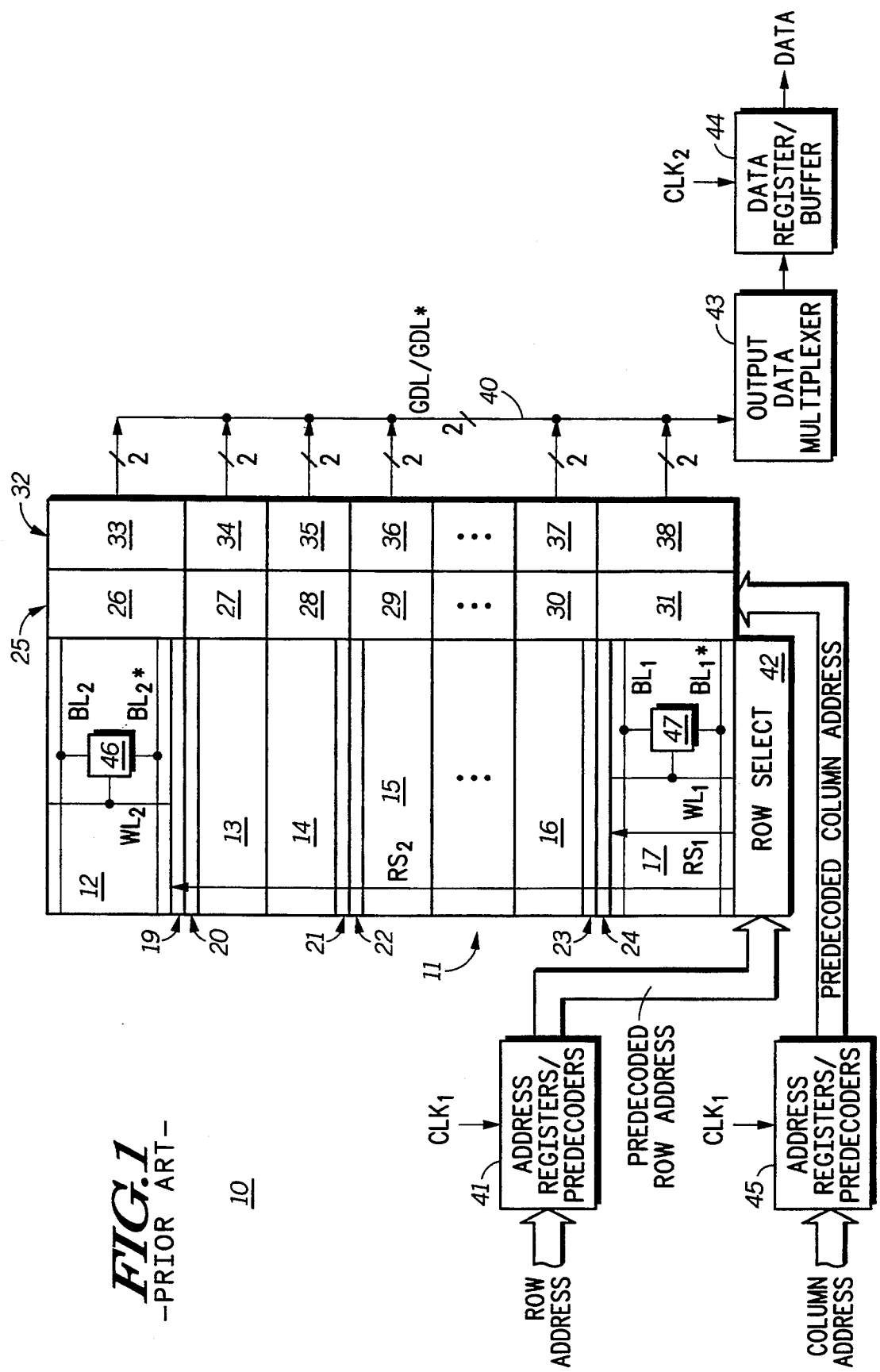
FIG. 1 illustrates in block diagram form, a static random access memory in accordance with the prior art.
Figure 2:
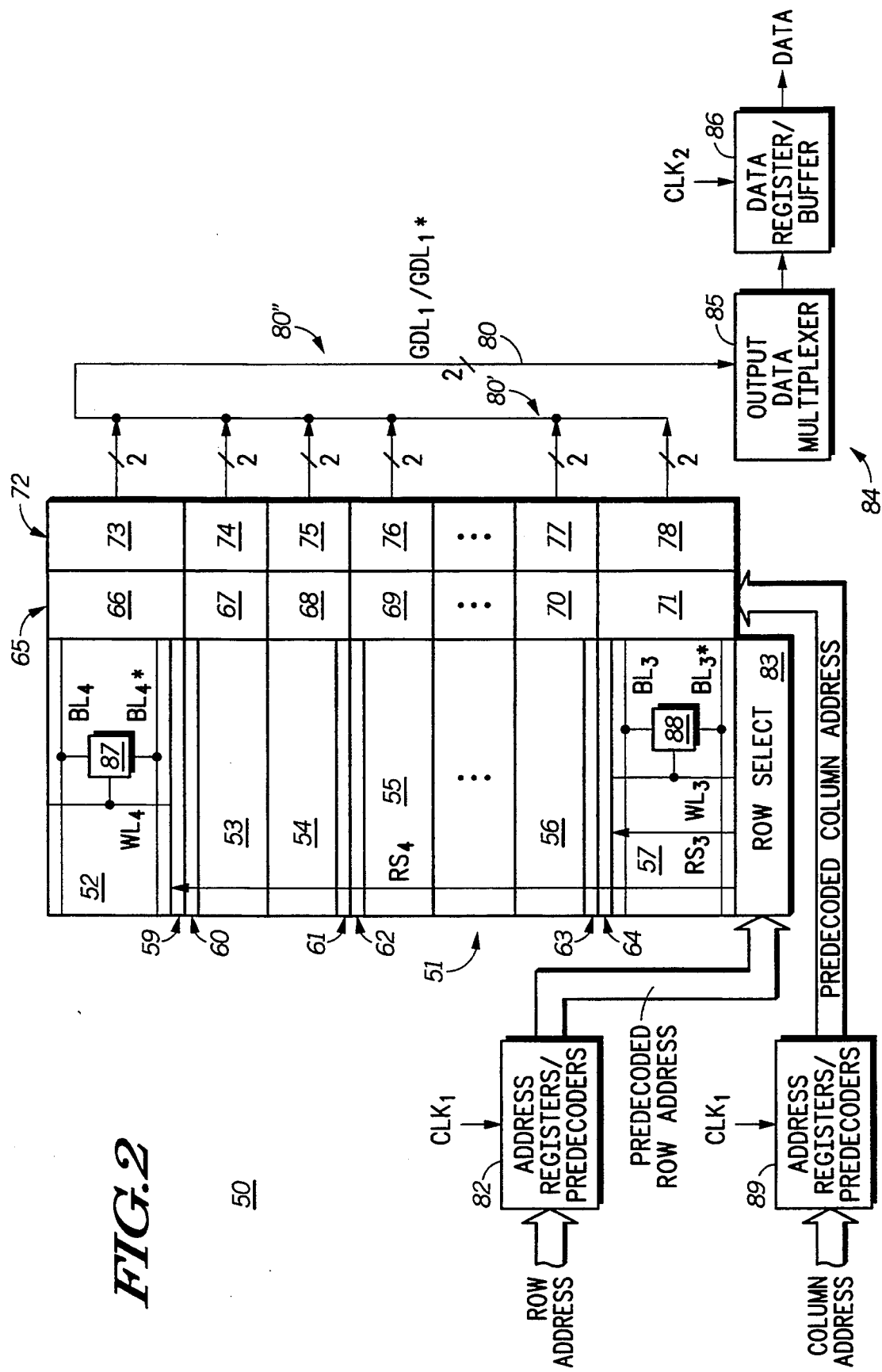
FIG. 2 illustrates in block diagram form, a static random access memory in accordance with the present invention.

The present invention can be more fully described with reference to FIG. 2. FIG. 2 illustrates in block diagram form, SRAM 50 in accordance with the present invention. SRAM 50 is a synchronous integrated circuit SRAM implemented in BICMOS and using the revolutionary pinout technique. A BICMOS integrated circuit is a circuit that includes bipolar transistors and CMOS (complementary metal-oxide semiconductor) transistors on the same integrated circuit. SRAM 50 includes memory array 51, word line drivers 59 64, address registers /predecoders 82, row select circuits 83, column decoders 65, sense amplifier block 72 global data line pair 80, and output data circuits 84.

Memory array 51 includes a plurality of sections of memory cells, such as memory cell blocks 52–57. As illustrated in FIG. 2 memory array 51 includes six memory cell blocks. However, any number of blocks can be used. Likewise, any number of memory arrays such as memory array 51 may be used. In FIG. 2, only one memory array 51 is illustrated for simplicity. Each block 52–57 includes a plurality of memory cells organized in rows and columns. A word line and the memory cells coupled to the word line comprise a row of memory cells. A bit line pair and the memory cells coupled to the bit line pair comprise a column of memory cells. Each memory cell is a conventional four transistor SRAM having polysilicon load resistors. However, the memory cells may also be six transistor SRAM cells using P-channel transistors as pull-up devices instead of using load resistors. The word lines cross each block in one direction and the bit line pairs cross each block orthogonal to the word lines. A memory cell is located at each intersection of the word lines and the bit line pairs. A representative memory cell is illustrated in each of blocks 52 and 57. Memory cell 87 in block 52 is coupled to a word line labeled "WL$_4$", and to a bit line pair labeled "BL$_4$" and "BL$_4$*". Memory cell 88 in block 57 is coupled to a word line labeled "WL$_3$", and to a bit line pair labeled "BL$_3$" and "BL$_3$*".

Each word line of memory array 51 is coupled to a word line driver. Word line drivers 59 are coupled to all of the word lines of block 52. Word line drivers 60 are coupled to all of the word lines of block 53. Word line drivers 61 are coupled to all of the word lines of block 54. Word line drivers 62 are coupled to all of the word lines of block 55. Word line drivers 63 are coupled to all of the word lines of block 56. Word line drivers 64 are coupled to all of the word lines of block 57. Each word line driver receives a row select signal from row select 83.

The memory cells of array 51 are addressable through row decoding and column decoding. Row decoding includes address registers/predecoders 82 and row select 83. Column decoders 65 include local column decoders 66–71, which couple a bit line pair to a sense amplifier during a read or a write cycle. A block of sense amplifiers 72 includes shared sense amplifiers 73–78. Each memory cell has a unique address at an intersection of a row and a column.

Address registers/predecoders 82 has a plurality of first input terminals for receiving row address signals labeled "ROW ADDRESS", a second input terminal for receiving a clock signal labeled "CLK$_1$", and a plurality of output terminals for providing predecoded row address signals labeled "PREDECODED ROW ADDRESS". Address registers/predecoders 89 has a plurality of first input terminals for receiving column address signals labeled "COLUMN ADDRESS", a second input terminal for receiving clock signal CLK$_1$, and a plurality of output terminals for providing predecoded column address signals labeled "PREDECODED COLUMN ADDRESS". A block address (not shown) is used to select one of the blocks 52–57. Note that the amount of decoding provided by address registers /predecoders 82 and 89 may be different in other embodiments, and is not important for describing the invention.

Sense amplifier block 72 includes shared sense amplifiers 73–78. Each bit line pair of array 51 is coupled to an input terminal of a shared sense amplifier through a local column decoder 66–71. For example, bit line pair BL$_4$ and BL$_4$* of block 52 is coupled to shared sense amplifier 73 through local column decoder 66. Shared sense amplifiers 73–78 each have output terminals coupled to read global data lines 80.

Data output circuits 84 includes output data multiplexer 85 and data register/buffer 86. Output data multiplexer 85 has first input terminals coupled to read global data lines 80, and an input terminal coupled to data register/buffer 86. Data register/buffer 86 has an output terminal for providing a data signal labeled "DATA". Output data multiplexer 85 has input terminals coupled to an end of read global data lines 80 for multiplexing data signals received from memory array 51 during a read cycle. Other read global data lines (not shown) may be coupled to output data multiplexer 85 from other memory arrays in memory 50.

Read global data lines 80 provide differential data signals, corresponding to data from a selected memory cell of array 51, to output data multiplexer 85. One pair of read global data lines 80 is illustrated in FIG. 2 for purposes of describing the invention. However, it is understood that more than one pair of read global data lines 80 may be used depending on the data organization of memory 50, and the size of array 51. Read global data lines 80 has a first portion 8' and a second portion 80". First portion 80' is proximate to, and extends along an edge of, array 51 from a bottom of array 51 to a top of the array 51, and is coupled to the output terminals of each of shared sense amplifiers 73–78. Read global data lines 80 is shared by shared sense amplifiers 73–78, such that only one of shared sense amplifiers 73–78 can provided data to read global data lines 80 during one read cycle. At the top of array 51, first portion 80' loops around 180 degrees and becomes second portion 80'. Second portion 80" of read global data lines 80 then extends to the bottom of array 51 where an end of second portion 80" is coupled to the input terminals of output data multiplexer 85. Both the first and second portions 80' and 80" are parallel to the row select lines, which is also parallel to the edge of array 51.

During a read cycle, read global data lines 80 reduces the difference between a minimum propagation delay and a maximum propagation delay of data from different locations in the plurality of memory blocks 52–57. The difference in the minimum propagation delay to the maximum propagation delay is reduced by increasing the minimum propagation delay, without affecting the maximum propagation delay. Thus, read global data lines 80 provides improved noise margins and allow for faster clock rates.

To read a data bit from memory cell 88, a row address and a column address is provided to address registers/predecoders 82 and 89. Address registers/predecoders 82 provide predecoded row address signals PREDECODED ROW ADDRESS to row select 83 in response to clock signal $CLK_1$. Row select 42 provides a row select signal labeled "$RS_3$" to word line drivers 64. Word line drivers 64 drive the voltage of word line $WL_3$ to a logic high, which selects the row of memory cells to which memory cell 88 is coupled. Column address signals COLUMN ADDRESS are provided to address registers/predecoders 89. Address registers/predecoders 89 provides predecoded column address signals PREDECODED COLUMN ADDRESS to column decoders 65 in response to clock signal $CLK_1$. Local column decoders 71 couples bit line pair $BL_3$ and $BL_3$* to a sense amplifier of shared sense amplifiers 78. The data bit stored in memory cell 88 exists as a relatively small differential voltage on the pair of complementary bit lines $BL_3$ and $BL_3$*. A sense amplifier from shared sense amplifiers 72 detects and amplifies the differential voltage and communicates it to output data multiplexer 85 as global data line signals $GDL_1/GDL_1$* via read global data lines 80. Note from FIG. 2 that shared sense amplifiers 78 are coupled to the first portion of read global data lines 80 near the bottom of array 51. Data register/buffer 86 receives a data signal corresponding to the data bit and latches it in response to clock signal $CLK_2$.

To read a data bit from memory cell 87, basically the same sequence of events occurs as described above concerning memory cell 88. Row select signal $RS_4$ drives word line $WL_4$ to a logic high, selecting the row of memory cells that includes memory cell 87. Bit line pair $BL_4$ and $BL_4$* are coupled to shared sense amplifiers 73 through local column decoder 66. Shared sense amplifiers 73 are coupled to first portion 80' of read global data lines 80 near the top of memory array 51. The data signal from memory cell 87 has a shorter distance to travel than the data signal from memory cell 88. However, row select signal $RS_4$ has a longer distance to travel than row select signal $RS_3$. As a result, the total access time for memory cell 87 during a read cycle is adjusted to be closer to the total access time of memory cell 88. The amount of data signal skewing between cells located in different parts of the memory is reduced. The difference in propagation delay between cells in opposite ends of the array is reduced. Thus, the timing margins for output data multiplexer 85 is increased, allowing the speed of output clock signal $CLK_2$ to be increased.

During a write cycle, memory 50 operates like a conventional synchronous SRAM.

While the invention has been described in the context of a preferred embodiment, it will be apparent to those skilled in the art that the present invention may be modified in numerous ways and may assume many embodiments other than that specifically set out and described above. For example, the SRAM array may be an array of DRAM (dynamic random access memory) cells. Also, memory 50 could be a CMOS memory instead of a BICMOS memory. Accordingly, it is intended by the appended claims to cover all modifications of the invention which fall within the true spirit and scope of the invention.

What is claimed is:

1. An integrated circuit memory, comprising:
   a plurality of memory cells arranged in rows and columns, a memory cell of the plurality of memory cells coupled to a word line and to a bit line, the word line extending across the plurality of memory cells in a direction orthogonal to a direction of the bit line; and
   a global data line having a first portion and a second portion, the first portion positioned proximate an edge of the plurality of memory cells, the first portion extending in a direction substantially parallel to the word line and coupled to the plurality of memory cells, the second portion coupled to an end of the first portion and extending substantially parallel to the first portion in a direction opposite to the direction of the first portion.

2. The integrated circuit memory of claim 1, wherein the plurality of memory cells comprises a plurality of static random access memory cells.

3. The integrated circuit memory of claim 1, wherein the global data line is further characterized as being a metal global data line.

4. The integrated circuit memory of claim 1, wherein the global data line comprises first and second global data lines for providing a differential data signal.

5. The integrated circuit memory of claim 1, wherein a sense amplifier is coupled between the first portion of the global data line and the plurality of memory cells.

6. The integrated circuit memory of claim 5, wherein the sense amplifier is characterized as a shared sense amplifier.

7. The integrated circuit memory of claim 1, further comprising an output data circuit coupled to the second portion of the global data line.

8. An integrated circuit memory, comprising:
   an array of memory cells arranged in rows and columns, a memory cell of the array coupled to a word line and to a bit line pair; and
   a looped global data line positioned proximate with, and extending substantially parallel to, an edge of the array, from a first end of the array to a second end of the array, the looped global data line having a loop at the second end of the array, and extending substantially parallel to the edge of the array from the loop back to the first end of the array, the looped global data line for providing a data signal corresponding to data stored in a selected memory cell of the array.

9. The integrated circuit memory of claim 8, wherein the array of memory cells is an array of static random access memory cells.

10. The integrated circuit memory of claim 8, wherein the looped global data line is characterized as being a metal looped global data line.

11. The integrated circuit memory of claim 8, further comprising a second looped global data line, the first and second looped global data lines for providing differential data signals corresponding to a data bit in a selected memory cell during a read cycle of the integrated circuit memory.

12. The integrated circuit memory of claim 8, wherein the looped global data line extends in a direction substantially parallel to a direction of the word line.

13. The integrated circuit memory of claim 8, wherein an output data circuit is coupled to an end of the looped global data line.

14. The integrated circuit memory of claim 8, wherein a sense amplifier is coupled between the array of memory cells and an end of the looped global data line.

15. A synchronous static random access memory, comprising:
   a plurality of memory cells arranged in rows and columns, each memory cell coupled to a word line and to a bit line pair;
   a row select circuit, coupled to the plurality of memory cells, for selecting the word line in response to a row address;
   a column decoder, coupled to the plurality of memory cells, for selecting the bit line pair in response to a column address;
   a sense amplifier, coupled to the column decoder, for sensing and amplifying a differential data signal corresponding to a data bit from a selected memory cell during a read cycle of the memory; and
   a read global data line pair, coupled to the sense amplifier, and extending along an edge of the plurality of memory cells from a first end of the plurality of memory cells to a second end of the plurality of memory cells, the read global data line pair substantially parallel to a row select line, and at the second end of the plurality of memory cells, the read global data line pair extending back in an opposite direction and substantially parallel to the row select line;
   wherein the read global data line pair is for adjusting an access time from different locations in the plurality of memory cells.

16. The synchronous static random access memory of claim 15, further comprising an output data multiplexer coupled to the read global data line pair.

17. The synchronous static random access memory of claim 15, further comprising data output circuits having an input terminal coupled to an end of the read global data line pair.

* * * * *